United States Patent
Arai et al.

(10) Patent No.: US 6,878,985 B2
(45) Date of Patent: Apr. 12, 2005

(54) NONVOLATILE SEMICONDUCTOR MEMORY DEVICE HAVING A MEMORY CELL THAT INCLUDES A FLOATING GATE ELECTRODE AND CONTROL GATE ELECTRODE

(75) Inventors: Fumitaka Arai, Yokohama (JP); Riichiro Shirota, Fujisawa (JP); Toshitake Yaegashi, Yokohama (JP); Akira Shimizu, Yokohama (JP); Yasuhiko Matsunaga, Kawasaki (JP); Masayuki Ichige, Yokohama (JP); Hisataka Meguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/382,772

(22) Filed: Mar. 7, 2003

(65) Prior Publication Data

US 2004/0104422 A1 Jun. 3, 2004

(30) Foreign Application Priority Data

Nov. 29, 2002 (JP) ......................................... 2002-348933

(51) Int. Cl.[7] .......................................... H01L 29/788
(52) U.S. Cl. ........................ 257/315; 257/316; 438/257
(58) Field of Search ................................ 257/315–316, 257/392, 510; 438/257

(56) References Cited

U.S. PATENT DOCUMENTS

6,274,434 B1    8/2001    Koido et al.
6,617,636 B2 *  9/2003    Tuan et al. .................. 257/315
6,643,186 B2 * 11/2003    Tuan et al. ............ 365/185.33
6,661,052 B2 * 12/2003    Matsui et al. ................ 257/316

FOREIGN PATENT DOCUMENTS

JP    11-163304    6/1999

* cited by examiner

*Primary Examiner*—Dung A. Le
(74) *Attorney, Agent, or Firm*—Oblon, Spivak, McClelland, Maier & Neustadt, P.C.

(57) ABSTRACT

Element isolation insulating layers have an STI structure, and their upper surfaces are flat. A floating gate electrode is formed in a recess which is formed by projections of the element isolation insulating layers. The two opposing side surfaces of the floating gate electrode are covered with the element isolation insulating layers. The upper surface of the floating gate electrode is substantially leveled with the upper surfaces of the element isolation insulating layers. A gate insulating layer is formed on the floating gate electrode and element isolation insulating layers. The underlayer of this gate insulating layer is flat. A control gate electrode is formed on the gate insulating layer.

7 Claims, 11 Drawing Sheets

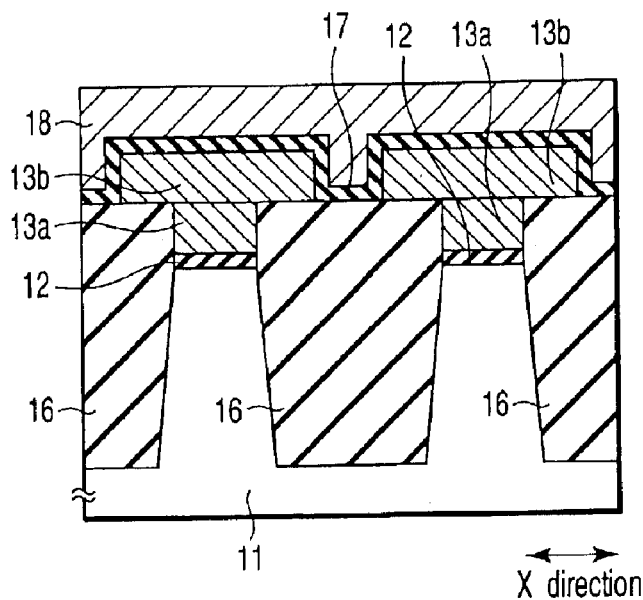
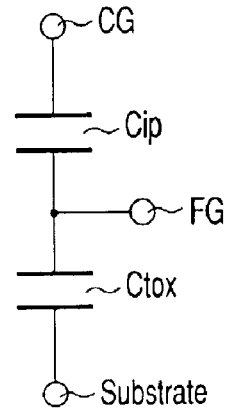
FIG. 1
PRIOR ART
FIG. 2
PRIOR ART
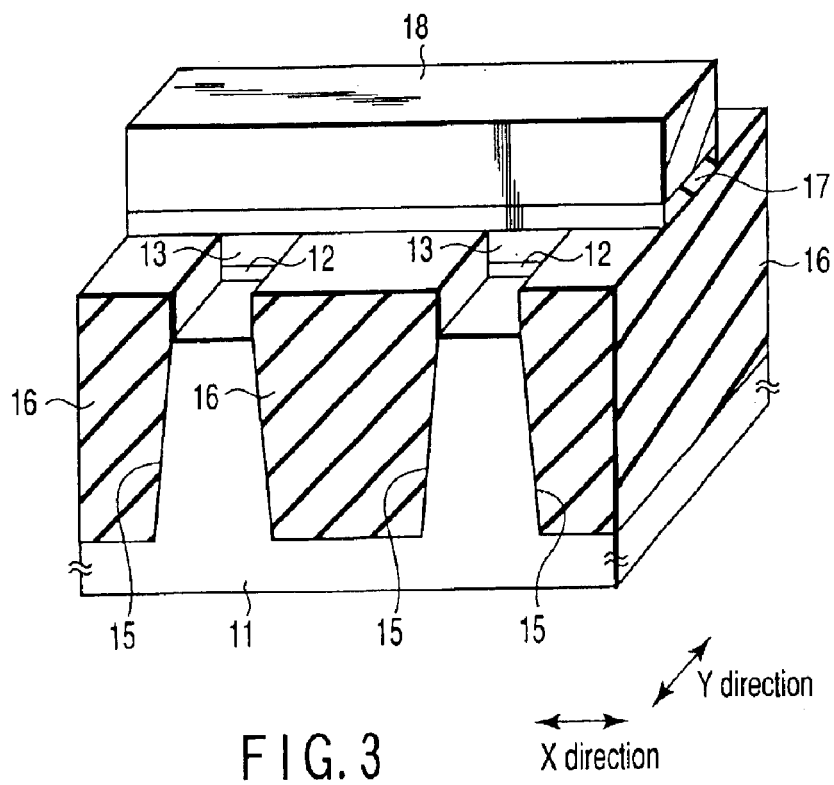
FIG. 3

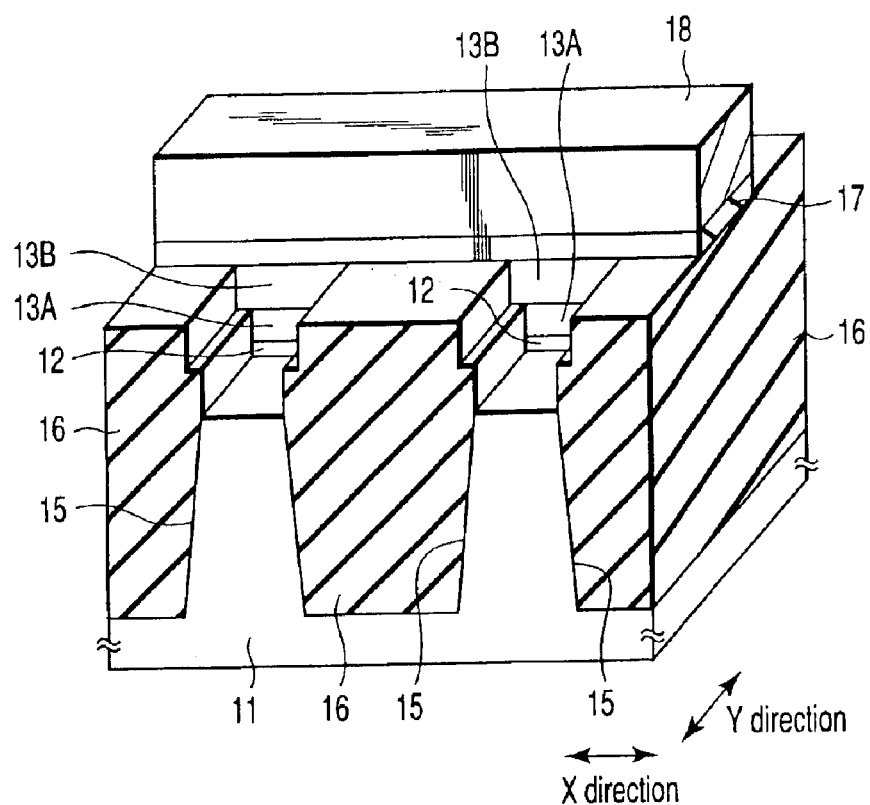
F I G. 10
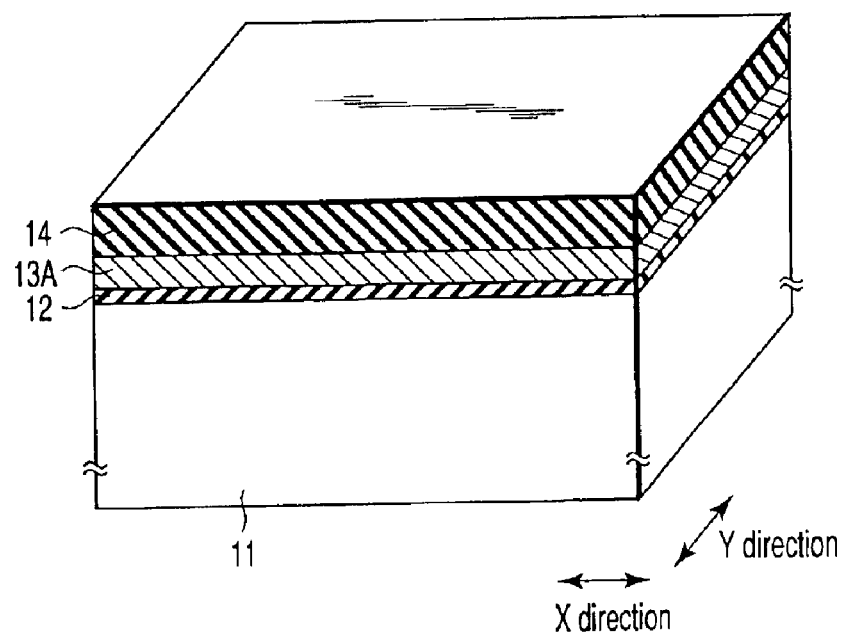
F I G. 11

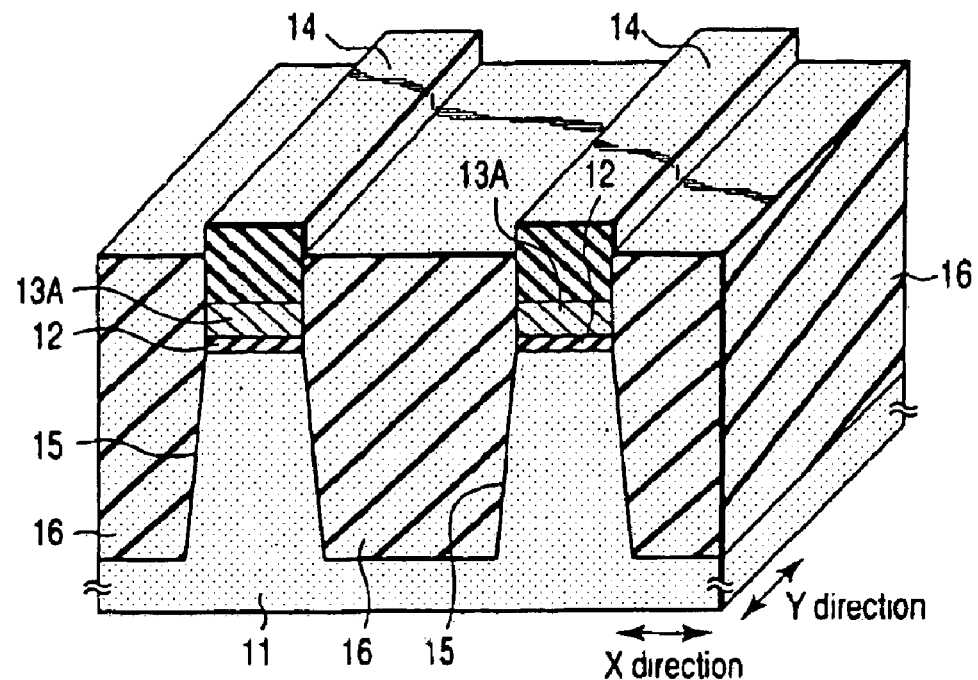
F I G. 14
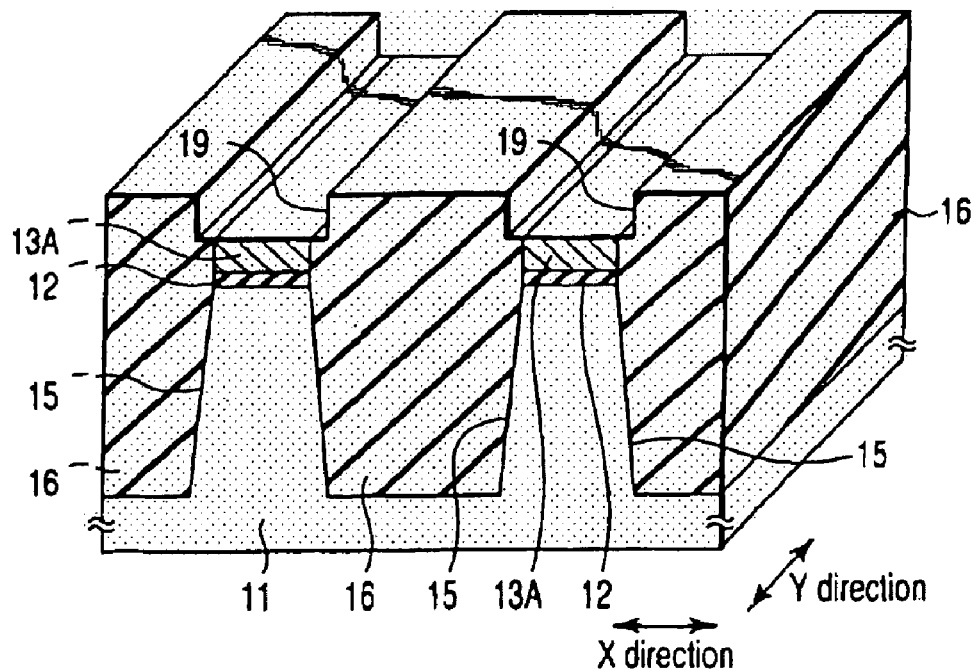
F I G. 15

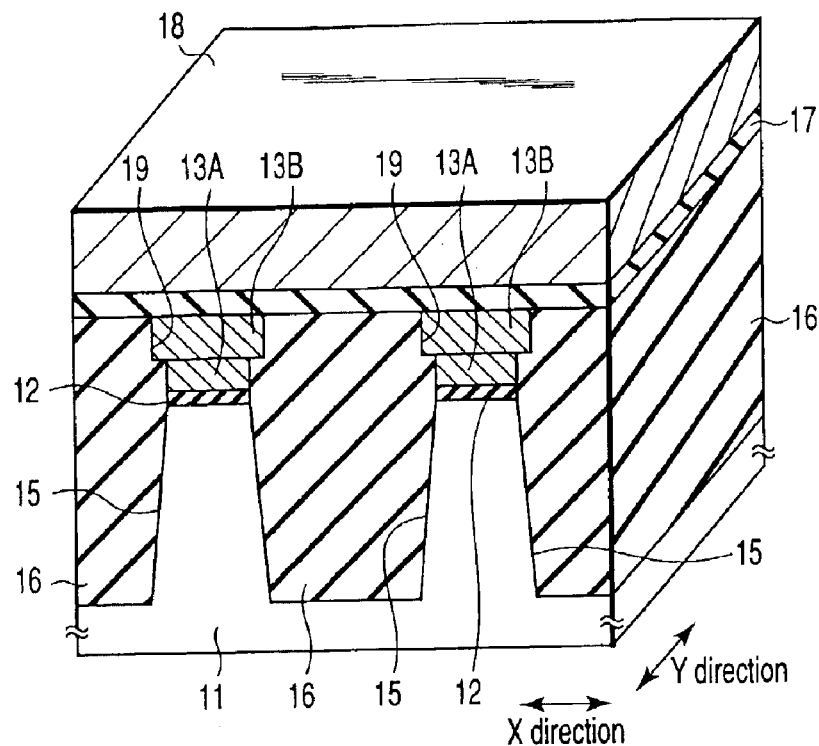
F I G. 16
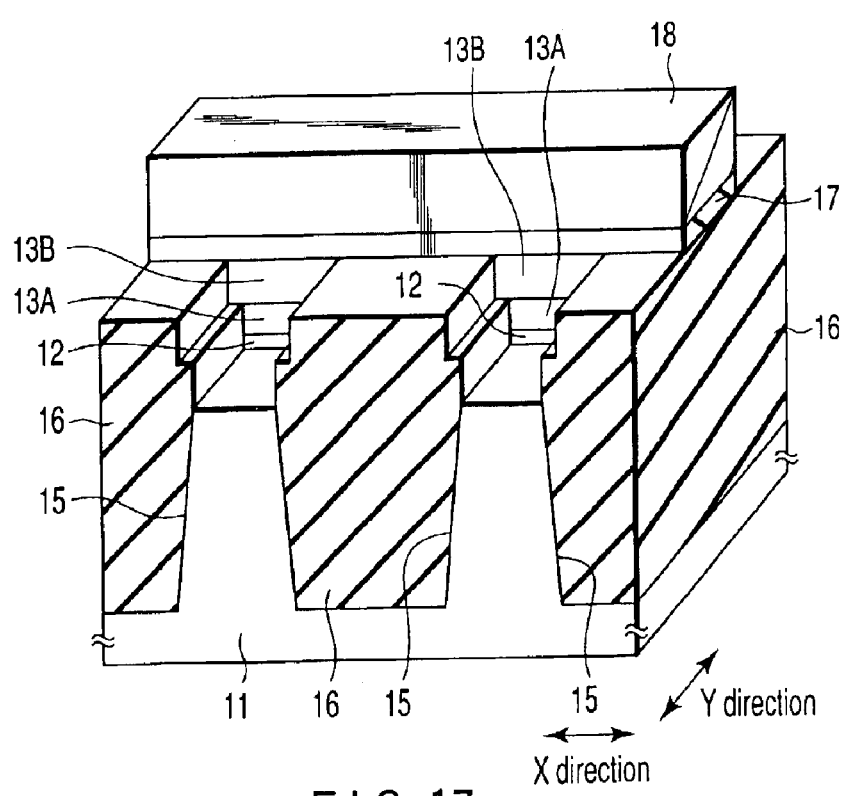
F I G. 17

NONVOLATILE SEMICONDUCTOR MEMORY DEVICE HAVING A MEMORY CELL THAT INCLUDES A FLOATING GATE ELECTRODE AND CONTROL GATE ELECTRODE

CROSS REFERENCE TO CO-PENDING APPLICATIONS

The subject matter of the present application is related to the following applications: Ser. No. 10/642,753 filed on Aug. 19, 2003, Ser. No. 10/648,510 filed on Aug. 27, 2003 and Ser. No. 10/878,372 filed on Jun. 29, 2004.

CROSS-REFERENCE TO RELATED APPLICATIONS

This application is based upon and claims the benefit of priority from the prior Japanese Patent Application No. 2002-348933, filed Nov. 29, 2002, the entire contents of which are incorporated herein by reference.

BACKGROUND OF THE INVENTION

1. Field of the Invention

The present invention relates to a nonvolatile semiconductor memory device and a manufacturing method of the same.

2. Description of the Related Art

A flash memory having a NAND, AND, or NOR cell array structure is conventionally known as a nonvolatile semiconductor memory device which uses a MOS transistor having a floating gate electrode and control gate electrode as a memory cell. The conventional techniques will be explained below by taking a NAND flash memory as an example.

FIG. 1 is a sectional view showing a portion of the cell array structure of a NAND flash memory.

In a silicon substrate 11, element isolation insulating layers 16 having an STI (Shallow Trench Isolation) structure are formed. Each element isolation insulating layer 16 protrudes from the upper surface of the silicon substrate 11, thereby forming a projection. The upper surface of this element isolation insulating layer 16 is flat.

In each recess formed by the projections of the element isolation insulating layers 16, i.e., on the silicon substrate 11 between these element isolation insulating layers 16, a tunnel oxide film 12 and floating gate electrode (lower portion) 13a are formed. The upper surfaces of the element isolation insulating layers 16 are substantially leveled with the upper surfaces of the floating gate electrodes 13a.

On each floating gate electrode 13a, a floating gate electrode (upper portion) 13b is formed. The end portions of this floating gate electrode 13b are present on the element isolation insulating layers 16. The floating gate electrodes 13a and 13b have a so-called gull wing shape as a whole.

The upper and side surfaces of each floating gate 13b are covered with an insulating layer 17. This insulating layer 17 has, e.g., an ONO structure. A control gate electrode 18 is formed on the insulating layer 17. This control gate electrode 18 is shared by memory cells arranged in the direction in which the control gate electrode 18 runs.

In this cell array structure, the space between the floating gate electrodes 13b is called a slit structure. This slit structure electrically disconnects the floating gate electrodes 13b adjacent in the direction in which the control gate electrode 18 runs, and also increases the area of a portion where the floating gate electrodes 13a and 13b oppose the control gate electrode 18.

That is, since the upper and side surfaces of the floating gate electrode 13b are covered with the insulating layer 17, the capacitance between the floating gate electrodes 13a and 13b and the control gate electrode 18 can be increased. Accordingly, electric charge can be stored in the floating gate electrodes 13a and 13b for long time periods.

Electrons are injected into the floating gate electrodes 13a and 13b by, e.g., applying a high write potential Vpgm to the control gate electrode 18 and a ground potential Vgnd to the silicon substrate 11. In this case, the electrons move from the silicon substrate 11 to the floating gate electrodes 13a and 13b by the FN tunneling phenomenon.

FIG. 2 shows an equivalent circuit of the memory cell by letting Cip denote the capacitance between the control gate electrode and floating gate electrode, and Ctox the capacitance between the floating gate electrode and silicon substrate.

For example, in the device structure shown in FIG. 1, the control gate electrode 18, insulating layer 17, and floating gate electrodes 13a and 13b can be regarded as capacitors, and the floating gate electrodes 13a and 13b, tunnel oxide film 12, and silicon substrate 11 can also be regarded as capacitors.

That is, as shown in FIG. 2, this memory cell is equivalent to a structure in which the two capacitors Cip and Ctox are connected in series between a control gate electrode CG and silicon substrate.

A potential Vfg of the floating gate electrode when a write potential Vcg (=Vpgm) is applied to the control gate electrode is determined by capacitive coupling between Cip and Ctox, and represented by $$Vfg = Cr \times (Vcg - Vt + Vt0)$$

$$Cr = Cip/(Cip + Ctox)$$

where Vt is the present cell transistor threshold value, and Vt0 is the threshold value (neutral threshold value) when no electric charge is stored in the floating gate electrode.

As Vfg rises, an electric field acting on the tunnel oxide film increases, and this facilitates injection of electric charge into the floating gate electrode.

In addition, according to the above equations, when Vcg is constant, Vfg increases in proportion to a capacitance ratio Cr. That is, when this capacitance ratio Cr is large, Vfg large enough to move electric charge can be obtained even if the write potential Vcg is decreased. As a consequence, the write potential can be reduced.

To increase the capacitance ratio Cr, Cip need only be made as large as possible with respect to Ctox.

The capacitance of a capacitor is proportional to a dielectric constant $\in$ of a thin film between opposing electrodes and an area S of the opposing electrodes, and inversely proportional to a distance d between the opposing electrodes.

For example, in the device structure shown in FIG. 1, the gate insulating layer 17 formed between the floating gate electrodes 13a and 13b and control gate electrode 18 is required to have a high dielectric constant, to be thin, and to be in contact with the two gate electrodes 13a and 13b in a broad range.

The tunnel oxide film 12 is very thin because it is formed to allow a tunnel current to easily flow with respect to a high electric field. However, the gate insulating layer 17 is much thicker than this tunnel oxide film 12 in order to prevent a leak by the tunnel current.

That is, to increase the capacitance ratio Cr, it is necessary to increase the dielectric constant of the gate insulating layer 17 and increase the area of a portion where this gate insulating layer 17 comes in contact with the floating gates 13a and 13b and control gate 18, thereby increasing Cip.

As the structure of the gate insulating layer 17 with which Cip is increased, a so-called ONO structure is conventionally known which realizes a dielectric constant larger than that of the material (e.g., $SiO_2$) forming the tunnel oxide film 12. In this ONO structure, SiN is sandwiched between $SiO_2$.

As the structure which increases the area of a portion where the floating gate electrodes 13a and 13b oppose the control gate electrode 18, a technique is known by which the gate insulating layer 17 is formed not only on the upper surfaces but also on the side surfaces of the floating gate electrodes 13a and 13b.

As micropatterning progresses, however, a reduction in the write potential Vcg has become a very serious problem for downsizing of a driving circuit. This is so because, as described above, Cip must be increased in order to reduce the write potential Vcg. The simplest method of increasing Cip is to increase the thickness of the floating gate electrodes 13a and 13b, thereby increasing the side wall area of these floating gate electrodes 13a and 13b.

Unfortunately, if the thickness of the floating gate electrodes 13a and 13b is increased, the depth of the slit structure also increases, and this increases the thickness of a mask layer required in slit fabrication. Also, when the floating gate electrodes 13a and 13b are processed, residues of these floating gate electrodes 13a and 13b are produced in the space between the element isolation insulating layers (STI) 16.

Cip can also be increased by using a material having a dielectric constant higher than that of the ONO film. Unfortunately, such a material having a high dielectric constant often has poor coverage for an underlayer having a step. Especially in the example shown in FIG. 1, film quality deterioration in the corners (slit portions) of the floating gate electrodes 13b occurs as a serious problem.

In addition, the etching selectivity of selective etching of a high-dielectric-constant material cannot be well increased compared to those of other materials forming a cell array structure. This makes gate fabrication and the like difficult.

As described above, as memory cell micropatterning advances, the conventional cell array structure cannot increase the capacitance between the floating gate electrodes and control gate electrode without posing any problems in terms of manufacture and the like. This makes it impossible to achieve high integration and a low write potential at the same time.

BRIEF SUMMARY OF THE INVENTION

A nonvolatile semiconductor memory device according to an aspect of the present invention comprises a semiconductor substrate, a first insulating layer having a projection which projects from the semiconductor substrate and has a flat upper surface, a floating gate electrode which is formed in a recess formed by the projections, and which has an upper surface substantially leveled with the upper surface of the first insulating layer, a second insulating layer formed on the upper surface of the first insulating layer and the upper surface of the floating gate electrode, and a control gate electrode formed on the second insulating layer, wherein the second insulating layer is made of a material having a dielectric constant higher than that of silicon oxide.

A manufacturing method of a nonvolatile semiconductor memory device according to an aspect of the present invention comprises the steps of forming a first conductive layer on a semiconductor substrate, forming a first mask layer on the first conductive layer, forming a trench by etching the first conductive layer and semiconductor substrate by using the first mask layer as a mask, forming a first insulating layer which completely fills the trench, polishing the first mask layer and first insulating layer until the upper surface of the first conductive layer is substantially leveled with the upper surface of the first insulating layer, forming a second insulating layer on the upper surface of the first insulating layer and the upper surface of the first conductive layer, and forming a second conductive layer on the second insulating layer.

A manufacturing method of a nonvolatile semiconductor memory device according to an aspect of the present invention comprises the steps of forming a first conductive layer on a semiconductor substrate, forming a first mask layer on the first conductive layer, forming a trench by etching the first conductive layer and semiconductor substrate by using the first mask layer as a mask, forming a first insulating layer which completely fills the trench, polishing the first insulating layer to such an extent that at least the upper surface of the first mask layer is exposed, removing the first mask layer to form a recess on the first conductive layer, forming, in the recess, a second conductive layer having an upper surface substantially leveled with the upper surface of the first insulating layer, forming a second insulating layer on the upper surface of the first insulating layer and the upper surface of the second conductive layer, and forming a third conductive layer on the second insulating layer.

BRIEF DESCRIPTION OF THE SEVERAL VIEWS OF THE DRAWING

FIG. 1 is perspective view showing an example of the cell array structure of a conventional memory;

FIG. 2 is a view showing an equivalent circuit of the memory cell array;

FIG. 3 is a perspective view showing the cell array structure of a memory according to the first embodiment of the present invention;

FIG. 10 is a perspective view showing the cell array structure of a memory according to the second embodiment of the present invention;

FIG. 11 is a perspective view showing a step of a method of implementing the structure shown in FIG. 10;

FIG. 14 is a perspective view showing a step of the method of implementing the structure shown in FIG. 10;

FIG. 15 is a perspective view showing a step of the method of implementing the structure shown in FIG. 10;

FIG. 16 is a perspective view showing a step of the method of implementing the structure shown in FIG. 10;

FIG. 17 is a perspective view showing a step of the method of implementing the structure shown in FIG. 10;

DETAILED DESCRIPTION OF THE INVENTION

Figure 4:
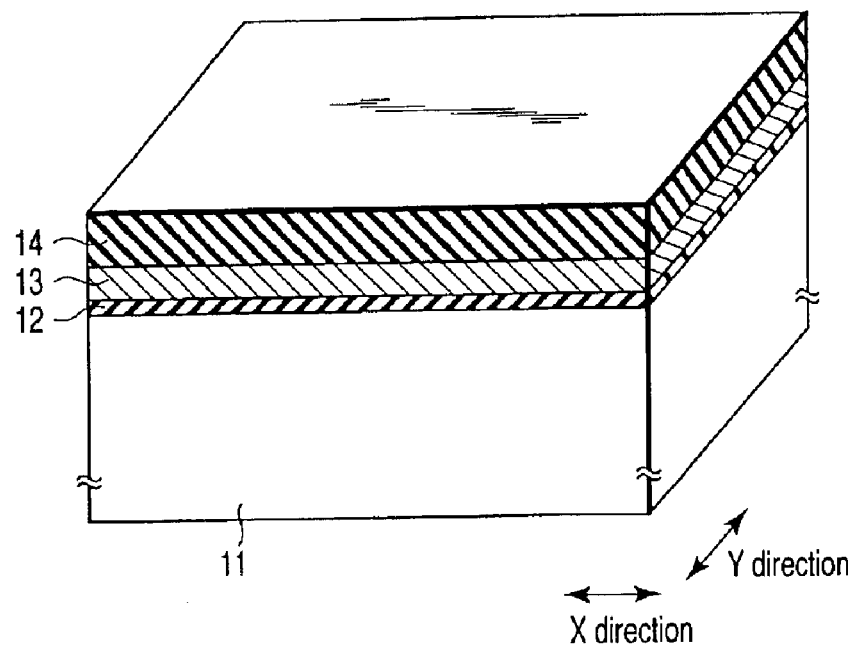
FIG. 4 is a perspective view showing a step of a method of implementing the structure shown in FIG. 3.

A nonvolatile semiconductor memory and a manufacturing method of the same according to aspects of the present invention will be described in detail below with reference to the accompanying drawing.

1. First Embodiment

① Cell Array Structure

FIG. 3 is a sectional view showing a portion of the cell array structure of a NAND flash memory according to the first embodiment of the present invention.

In a silicon substrate 11, element isolation insulating layers 16 having an STI (Shallow Trench Isolation) structure are formed. Each element isolation insulating layer 16 protrudes from the upper surface of the silicon substrate 11, thereby forming a projection. The upper surface of this element isolation insulating layer 16 is flat.

In each recess formed by the projections of the element isolation insulating layers 16, i.e., on the silicon substrate 11 between these element isolation insulating layers 16, a tunnel oxide film 12 and floating gate electrode 13 are formed. The upper surfaces of the element isolation insulating layers 16 are substantially leveled with the upper surfaces of the floating gate electrodes 13.

The side surfaces of each floating gate electrode 13 are covered with the element isolation insulating layers 16. A gate insulating layer 17 is formed on the floating gate electrodes 13 and element isolation insulating layers 16. This gate insulating layer 17 is in contact with each floating gate electrode 13 only on its upper surface.

A control gate electrode 18 is formed on the gate insulating layer 17. This control gate electrode 18 is shared by memory cells arranged in the direction in which the control gate electrode 18 runs.

In this cell array structure, the side surfaces of each floating gate electrode 13 are covered with the element isolation insulating layers 16, and the gate insulating layer 17 is in contact with each floating gate electrode 13 only on its upper surface. Also, no slit structure of the floating gate electrodes 13 is present on the element isolation insulating layer 16.

Accordingly, memory cells can be micropatterned, and the problem of fabrication, e.g., the residue of the floating gate electrodes 13 can be eliminated.

In addition, the gate insulating layer 17 is in contact with each floating gate electrode 13 only on its upper surface. That is, the underlayer of this gate insulating layer 17 is flat. Accordingly, a material inferior in coverage in a corner such as a perovskite structure can be used as the gate insulating layer 17.

More specifically, as this gate insulating layer 17, it is possible to use $SiO_2$, an ONO film, and materials (either single-layered or multilayered) having dielectric constants higher than those of $SiO_2$ and ONO film, e.g., $Ai_2O_3$, $SiO_2$—$Al_2O_3$—$SiO_2$, and $SiO_2$—$SiN$—$Al_2O_3$.

Since the underlayer is flat, the gate insulating layer 17 can be formed evenly and homogeneously. Also, since the gate insulating layer 17 itself is flat, this gate insulating layer 17 can be readily etched when, e.g., gate patterning is performed. Therefore, the gate insulating layer 17 can be made of a material such as $Al_2O_3$ which is very difficult to etch.

In this embodiment, the side surfaces of each floating gate electrode 13 are not used as the electrodes of a capacitor. This reduces the area of a portion where the floating gate electrode 13 opposes the control gate electrode 18, compared to the conventional devices.

Since, however, the underlayer of the gate insulating layer 17 is flat, it is possible to increase the number of choices of the material forming this gate insulating layer 17 from the viewpoint of a high dielectric constant. Also, there is, of course, no film quality deterioration in the corners of each floating gate electrode 13. Accordingly, the gate insulating layer 17 can be made thinner than in a memory using a slit structure.

From the foregoing, it is finally possible to increase the capacitance between the floating gate electrode 13 and control gate electrode 18, thereby achieving high integration and a low write potential at the same time.

② Manufacturing Method

A manufacturing method of the cell array structure shown in FIG. 3 will be described below.

FIGS. 4 to 9 illustrate the individual steps of the manufacturing method of implementing the cell array structure shown in FIG. 3.

First, as shown in FIG. 4, a tunnel oxide film 12 and a conductive layer 13 and mask layer 14 for forming floating gate electrodes are sequentially formed on a silicon substrate 11 by CVD (Chemical Vapor Deposition). The conductive layer 13 is made of, e.g., conductive polysilicon containing an impurity. The mask layer 14 is made of, e.g., $SiO_2$.

Figure 5:
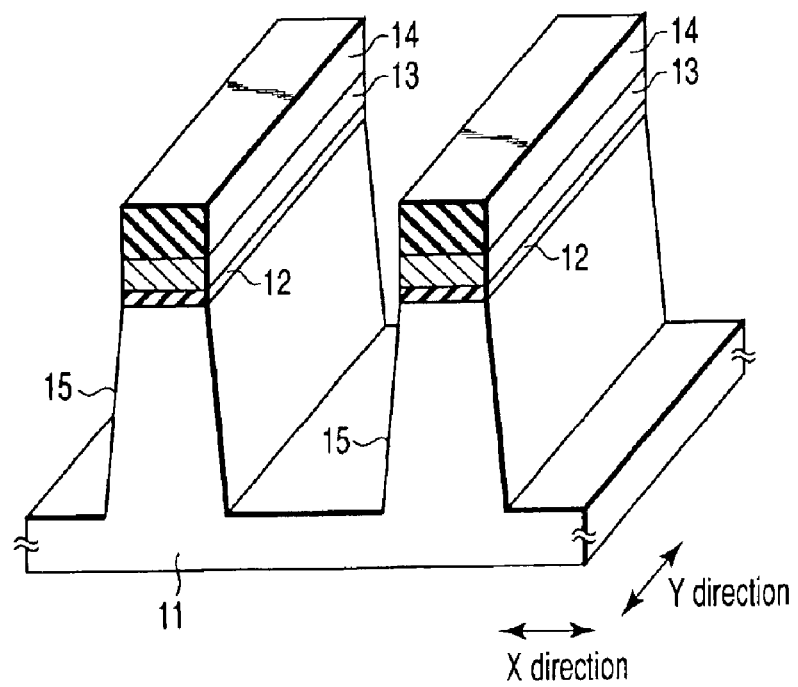
FIG. 5 is a perspective view showing a step of the method of implementing the structure shown in FIG. 3.

As shown in FIG. 5, a resist pattern is formed by PEP (Photo Engraving Process), and the mask layer 14 is patterned by using this resist pattern as a mask. After that, the resist pattern is removed. By using the patterned mask layers 14 as masks, the conductive layer 13, tunnel oxide layer 12, and silicon substrate 11 are sequentially etched by RIE. As a result, trenches 15 are formed in the silicon substrate 11.

Figure 6:
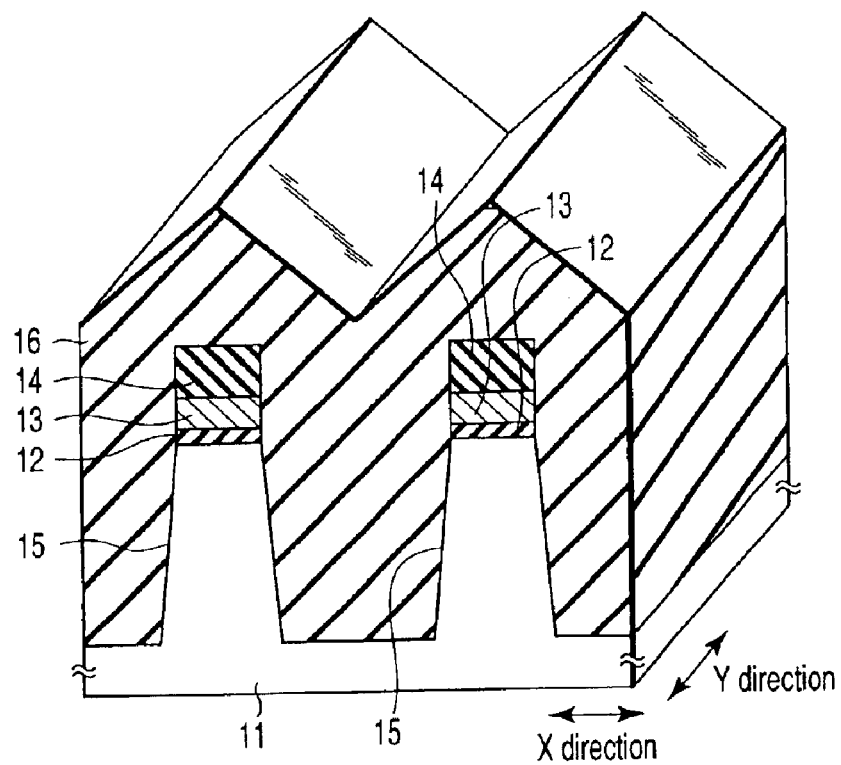
FIG. 6 is a perspective view showing a step of the method of implementing the structure shown in FIG. 3.

As shown in FIG. 6, an insulating layer 16 which completely fills the trenches 15 and completely covers the conductive layers 13 and mask layers 14 is formed by CVD. In this embodiment, this insulating layer 16 is made of $SiO_2$, the same material as the mask layers 14.

Figure 7:
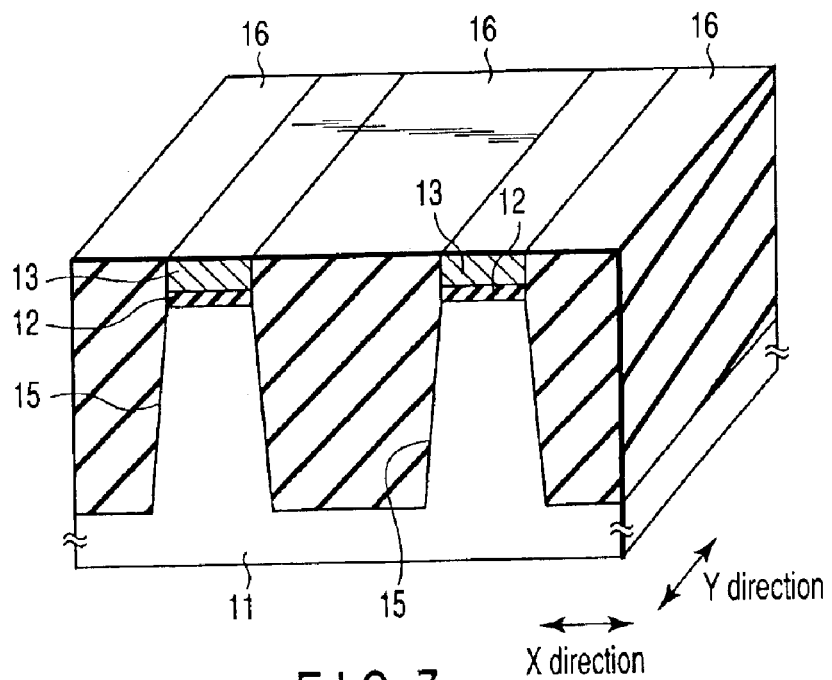
FIG. 7 is a perspective view showing a step of the method of implementing the structure shown in FIG. 3.

As shown in FIG. 7, the mask layers 14 and insulating layer 16 are polished by CMP (Chemical Mechanical Polishing), thereby forming element isolation insulating layers 16 having an STI structure. The mask layers 14 are completely removed by CMP, and the insulating layers 16 are polished to such an extent that the upper surfaces of these insulating layers 16 are substantially leveled with the upper surfaces of the conductive layers 13.

Figure 8:
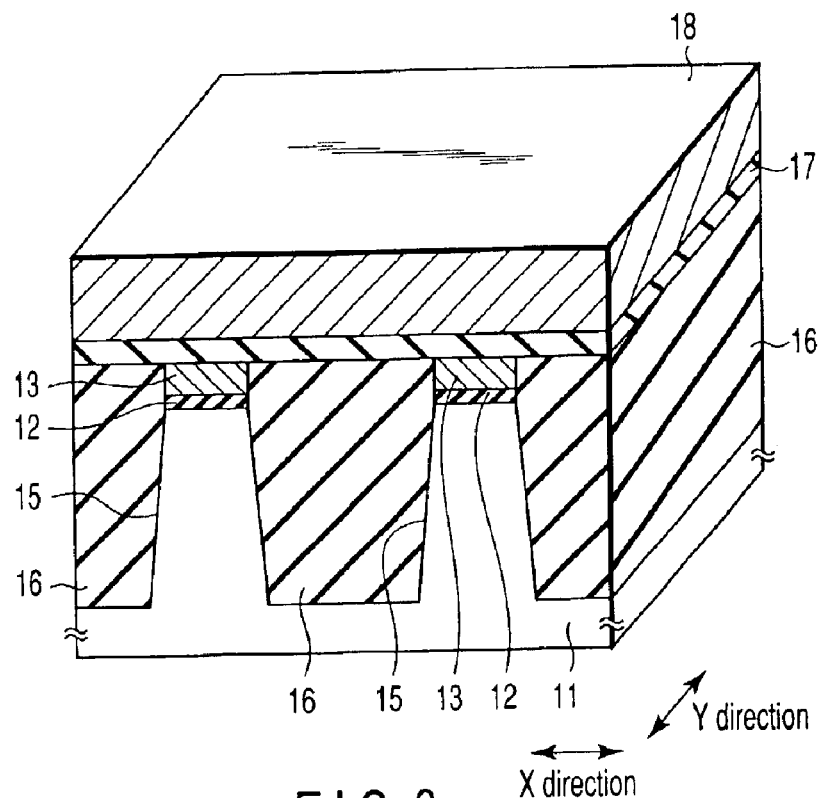
FIG. 8 is a perspective view showing a step of the method of implementing the structure shown in FIG. 3.

As shown in FIG. 8, a gate insulating layer 17 and a conductive layer 18 for forming a control gate electrode are sequentially formed on the conductive layers 13 and element isolation insulating layers 16 by CVD. The gate insulating layer 17 is an insulating layer having a high dielectric constant. The conductive layer 18 is made of, e.g., conductive polysilicon containing an impurity.

Figure 9:
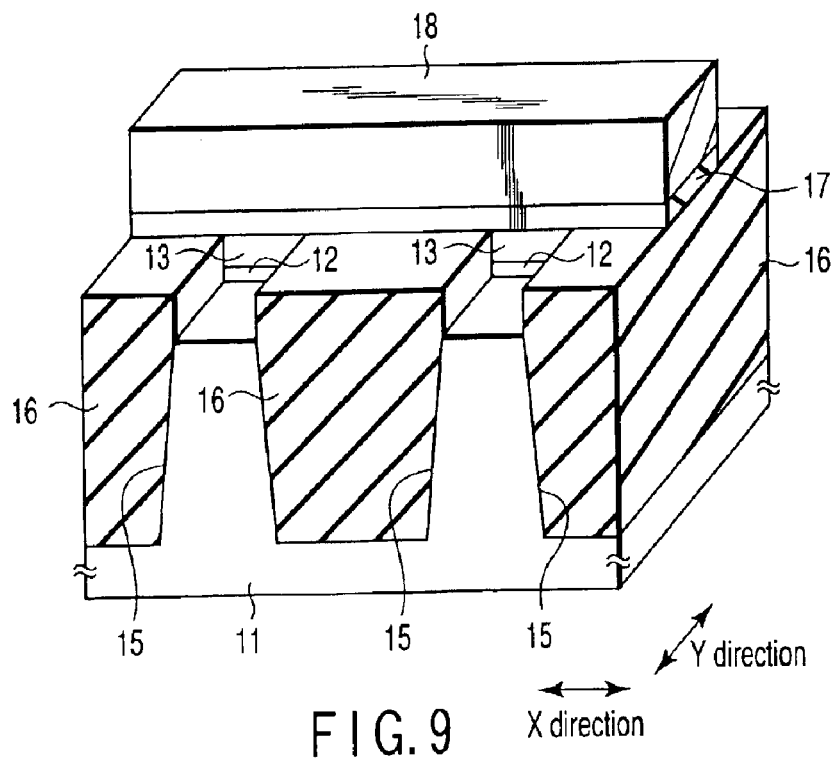
FIG. 9 is a perspective view showing a step of the method of implementing the structure shown in FIG. 3.

Finally, as shown in FIG. 9, a resist pattern is formed by PEP, and gate fabrication is performed by using this resist pattern. That is, the resist pattern is used as a mask to etch the conductive layer 18 by RIE, thereby forming a control gate electrode. Subsequently, the gate insulating layer 17, conductive layers 13, and tunnel oxide films 12 are etched to form floating gate electrodes.

Through the above steps, the cell array structure shown in FIG. 3 is completed.

③ Summary

In the cell array structure and manufacturing method of the same as described above, the side surfaces of the floating gate electrodes are covered with the element isolation insulating layers, and the gate insulating layer is in contact with each floating gate electrode only on its upper surface. Also, no slit structure of the floating gate electrodes is present on the element isolation insulating layer.

Accordingly, the gate insulating layer can be made of a high-dielectric-constant material, and the thickness of the gate insulating layer can be decreased. This makes it possible to increase the capacitance between the floating gate electrode and control gate electrode, and achieve high integration and a low write potential at the same time.

2. Second Embodiment

① Cell Array Structure

FIG. 10 is a sectional view showing a portion of the cell array structure of a NAND flash memory according to the second embodiment of the present invention.

In a silicon substrate 11, element isolation insulating layers 16 having an STI structure are formed. Each element isolation insulating layer 16 protrudes from the upper surface of the silicon substrate 11, thereby forming a projection. The upper surface of this element isolation insulating layer 16 is flat.

In each recess formed by the projections of the element isolation insulating layers 16, i.e., on the silicon substrate 11 between these element isolation insulating layers 16, a tunnel oxide film 12 and floating gate electrodes 13A and 13B are formed. The upper surfaces of the element isolation insulating layers 16 are substantially leveled with the upper surfaces of the floating gate electrodes 13A and 13B.

In this embodiment, the width of each recess formed by the projections of the element isolation insulating layers 16 is not constant, i.e., the width is largest in the uppermost portion of the recess. As a consequence, the area of a portion where the floating gate electrodes 13A and 13B oppose a control gate electrode 18 is larger than the area of a portion where the floating gate electrodes 13A and 13B oppose the silicon substrate 11.

The side surfaces of the floating gate electrodes 13A and 13B are covered with the element isolation insulating layers 16. A gate insulating layer 17 is formed on the floating gate electrodes 13A and 13B and element isolation insulating layers 16. This gate insulating layer 17 is in contact with the floating gate electrodes 13A and 13B only on their upper surface.

In this embodiment, the floating gate electrodes 13A and 13B are formed by stacking two layers. However, three or more layers can also be stacked.

The control gate electrode 18 is formed on the gate insulating layer 17. This control gate electrode 18 is shared by memory cells arranged in the direction in which the control gate electrode 18 runs.

In this cell array structure, the floating gate electrodes 13A and 13B have a stacked structure. In addition, the recess in which these floating gate electrodes 13A and 13B are formed is widest in its uppermost portion.

Furthermore, the side surfaces of the floating gate electrodes 13A and 13B are covered with the element isolation insulating layers 16, and the gate insulating layer 17 is in contact with the floating gate electrodes 13A and 13B only on their upper surface. Also, no slit structure of the floating gate electrodes 13A and 13B is present on the element isolation insulating layer 16.

Accordingly, as in the first embodiment, it is possible to increase the capacitance between the floating gate electrodes 13A and 13B and control gate electrode 18, and achieve high integration and a low write potential at the same time.

Also, in the second embodiment, the floating gate electrodes 13A and 13B have a stacked structure, and the recess in which these floating gate electrodes 13A and 13B are formed is widest in its uppermost portion. This eliminates the problem of fabrication, particularly the coverage and residue of the floating gate electrode 13B.

In addition, the gate insulating layer 17 is in contact with the floating gate electrodes 13A and 13B only on their upper surface. That is, the underlayer of this gate insulating layer 17 is flat. Accordingly, as in the first embodiment, a material inferior in coverage in a corner such as a perovskite structure can be used as the gate insulating layer 17.

Since the underlayer is flat, the gate insulating layer 17 can be formed evenly and homogeneously. Also, since the gate insulating layer 17 itself is flat, this gate insulating layer 17 can be readily etched when, e.g., gate patterning is performed. Therefore, as in the first embodiment, the gate insulating layer 17 can be made of a material which is very difficult to etch.

As in the first embodiment, the side surfaces of the floating gate electrodes 13A and 13B are not used as the electrodes of a capacitor. This reduces the area of a portion where the floating gate electrodes 13A and 13B oppose the control gate electrode 18, compared to the conventional devices.

Since, however, the underlayer of the gate insulating layer 17 is flat, it is possible to increase the number of choices of the material forming this gate insulating layer 17 from the viewpoint of a high dielectric constant. Also, there is, of course, no film quality deterioration in the corners of the floating gate electrodes 13A and 13B. Accordingly, the gate insulating layer 17 can be made thinner than in a memory using a slit structure.

Furthermore, each recess in which the floating gate electrodes 13A and 13B are formed is widest in its uppermost portion. This increases the area of portion where the floating gate electrodes 13A and 13B oppose the control gate electrode 18.

From the foregoing, it is finally possible to increase the capacitance between the floating gate electrodes 13A and 13B and control gate electrode 18, thereby achieving high integration and a low write potential at the same time.

② Manufacturing Method

A manufacturing method of the cell array structure shown in FIG. 10 will be described below.

FIGS. 11 to 17 illustrate the individual steps of the manufacturing method of implementing the cell array structure shown in FIG. 10.

First, as shown in FIG. 11, a tunnel oxide film 12 and a conductive layer 13A and mask layer 14 for forming floating gate electrodes are sequentially formed on a silicon substrate 11 by CVD. The conductive layer 13A is made of, e.g., conductive polysilicon containing an impurity. The mask layer 14 is made of, e.g., SiN.

Figure 12:
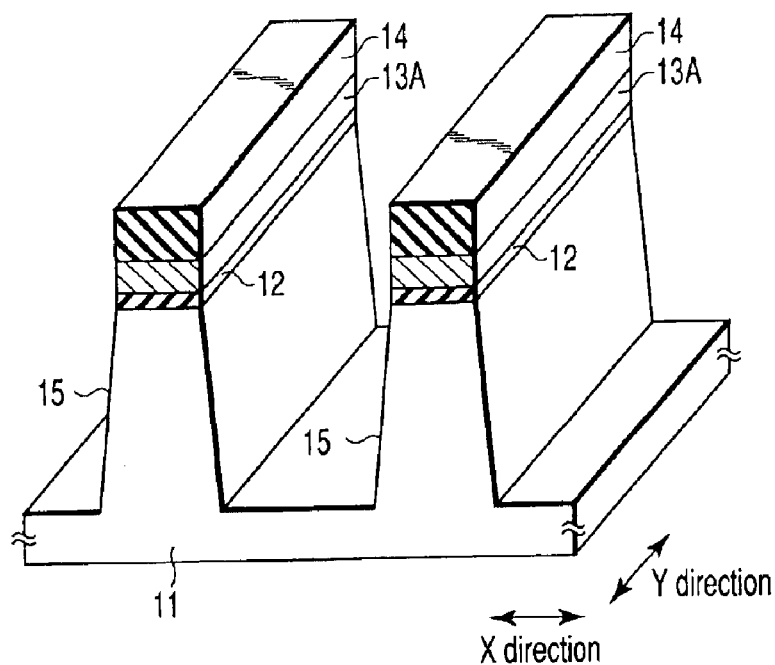
FIG. 12 is a perspective view showing a step of the method of implementing the structure shown in FIG. 10.

Next, as shown in FIG. 12, a resist pattern is formed by PEP (Photo Engraving Process), and the mask layer 14 is patterned by using this resist pattern as a mask. After that, the resist pattern is removed. By using the patterned mask layers 14 as masks, the conductive layer 13A, tunnel oxide layer 12, and silicon substrate 11 are sequentially etched by RIE. As a result, trenches 15 are formed in the silicon substrate 11.

Figure 13:
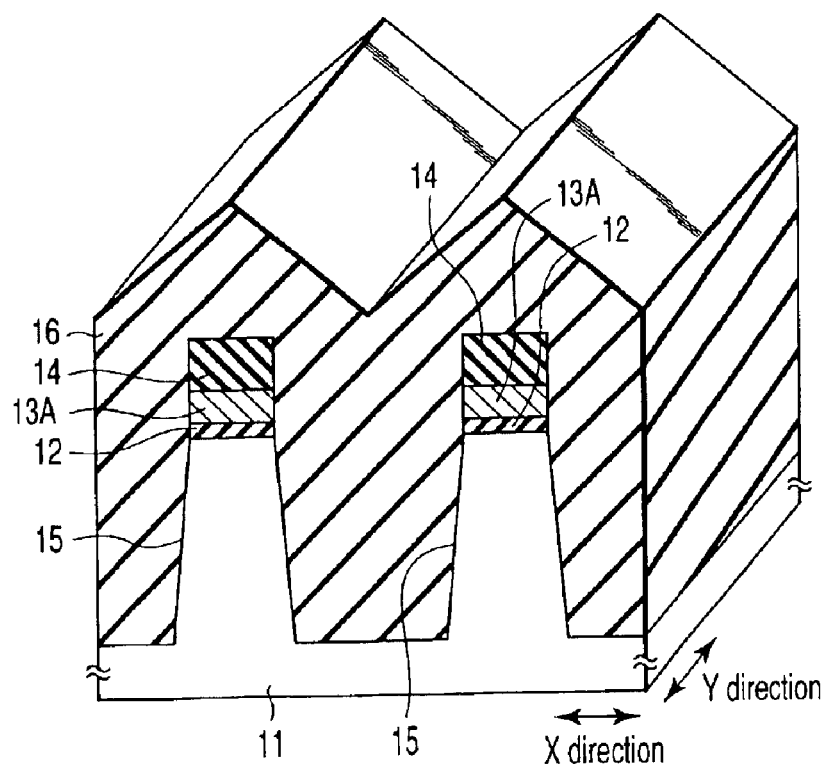
FIG. 13 is a perspective view showing a step of the method of implementing the structure shown in FIG. 10.

As shown in FIG. 13, an insulating layer 16 which completely fills the trenches 15 and completely covers the conductive layers 13A and mask layers 14 is formed by CVD. In this embodiment, this insulating layer 16 is made of $SiO_2$ different from the material of the mask layers 14.

As shown in FIG. 14, the insulating layer 16 is polished by CMP to form element isolation insulating layers 16 having an STI structure. The mask layers 14 function as stoppers in this CMP. The insulating layers 16 are polished to such an extent that at least the upper surfaces of the mask layers 14 are exposed. In practice, as shown in FIG. 14, polishing of the insulating layers 16 is stopped when the upper surfaces of these insulating layers 16 become slightly lower than the upper surfaces of the mask layers 14.

After that, the mask layers 14 are removed. When the mask layers 14 are thus removed, recesses are formed on the conductive layers 13A.

As shown in FIG. 15, the process of widening the recess on each conductive layer 13A is executed. For example, these recesses on the conductive layers 13A are widened by etching the insulating layers 16 by isotropic etching such as wet etching. Consequently, the width of each recess becomes larger than the width of each conductive layer 13A.

As shown in FIG. 16, a conductive layer 13B which completely fills the recesses and completely covers the element isolation insulating layers 16 is formed by CVD. In this embodiment, this conductive layer 13B is made of conductive polysilicon containing an impurity, the same material as the conductive layers 13A. The conductive layer 13B is then polished by CMP and left behind only in the recesses. That is, the conductive layers 13B are polished to such an extent that their upper surfaces are substantially leveled with the element isolation insulating layers 16. The element isolation insulating layers 16 function as stoppers in CMP.

Note that even if the conductive layers 13B are polished too much, at least the thickness of the conductive layers 13A is guaranteed as a floating gate electrode since these conductive layers 13A are already formed.

After that, a gate insulating layer 17 and a conductive layer 18 for forming a control gate electrode are sequentially formed on the conductive layers 13A and 13B and element isolation insulating layers 16 by CVD. The gate insulating layer 17 is an insulating layer having a high dielectric constant. The conductive layer 18 is made of, e.g., conductive polysilicon containing an impurity.

Finally, as shown in FIG. 17, a resist pattern is formed by PEP, and gate fabrication is performed by using this resist pattern. That is, the resist pattern is used as a mask to etch the conductive layer 18 by RIE, thereby forming a control gate electrode. Subsequently, the gate insulating layer 17, conductive layers 13A and 13B, and tunnel oxide films 12 are etched to form floating gate electrodes.

Through the above steps, the cell array structure shown in FIG. 10 is completed.

③ Summary

In the cell array structure and manufacturing method of the same as described above, the same effects as in the first embodiment can be obtained. That is, it is possible to increase the capacitance between the floating gate electrode and control gate electrode, and achieve high integration and a low write potential at the same time. In addition, the multilayered structure of the floating gate electrode eliminates problems in fabrication and guarantees a minimum value of the thickness of the floating gate electrode. Furthermore, the recess in which the floating gate electrode is formed is widest in its upper most portion. This increases the area of a portion where the floating gate electrode opposes the control gate electrode.

3. Third Embodiment

① Cell Array Structure

FIG. 28 is a sectional view showing a portion of the cell array structure of a NAND flash memory according to the third embodiment of the present invention.

The device structure of this embodiment is a modification of the device structure of the second embodiment. The device structure of this embodiment is characterized in that the shape of a recess formed by projections of element isolation insulating layers is different from that in the second embodiment. The rest is exactly the same as the second embodiment.

Figure 18:
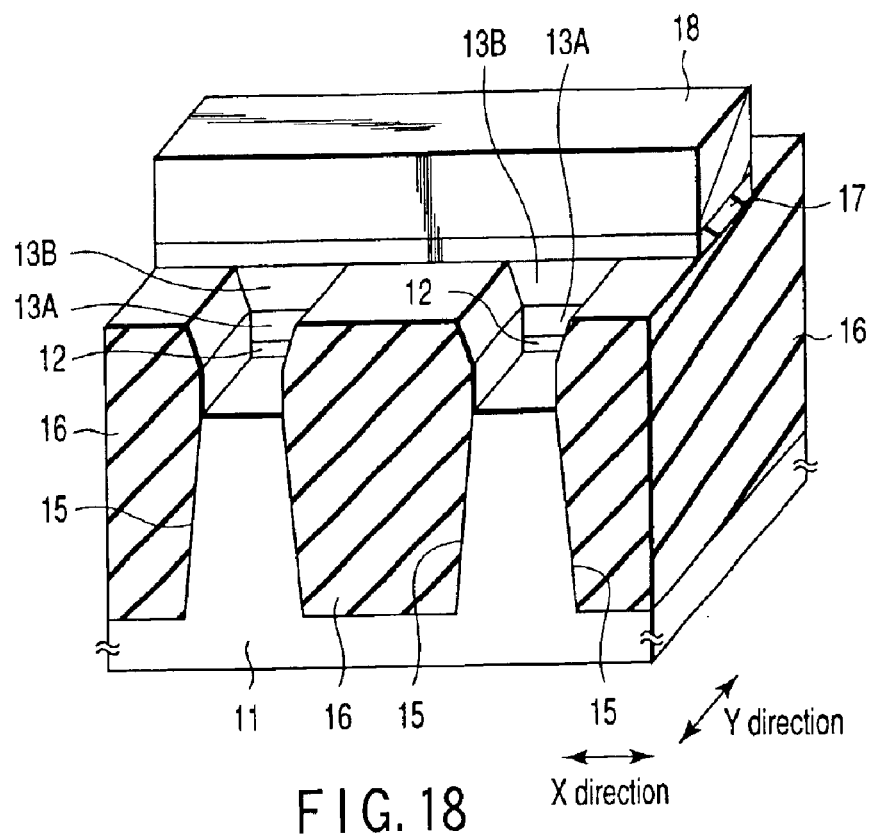
FIG. 18 is a perspective view showing the cell array structure of a memory according to the third embodiment of the present invention.

That is, in the second embodiment as shown in FIG. 10, the side surfaces of each recess formed by the projections of the element isolation insulating layers 16 have a staircase shape. On the other hand, in the third embodiment as shown in FIG. 18, the side surfaces of each recess formed by projections of element isolation insulating layers 16 are partially inclined.

Consequently, each recess formed by the projections of the element isolation insulating layers 16 is widest in its uppermost portion. This increases the area of a portion where floating gate electrodes 13A and 13B oppose a control gate electrode 18, thereby increasing the capacitance between these gate electrodes.

The device structure of this embodiment also achieves the same effects as the device structure of the second embodiment.

② Manufacturing Method

A manufacturing method the cell array structure shown in FIG. 18 will be described below.

FIGS. 19 to 22 illustrate the individual steps of the manufacturing method of implementing the cell array structure shown in FIG. 18.

Figure 19:
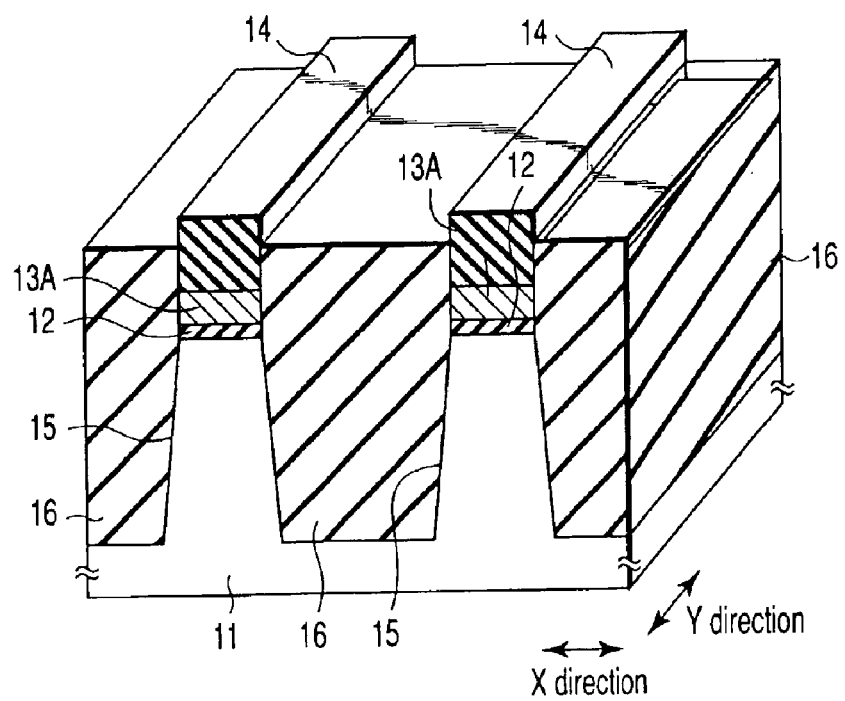
FIG. 19 is a perspective view showing a step of a method of implementing the structure shown in FIG. 18.

First, as shown in FIG. 19, the steps until element isolation insulating layers 16 having an STI structure are formed by CMP are executed in the same manner as in the second embodiment described above (see FIGS. 11 to 14).

After that, mask layers 14 are removed. When the mask layers 14 are thus removed, recesses are formed on conductive layers 13A.

Figure 20:
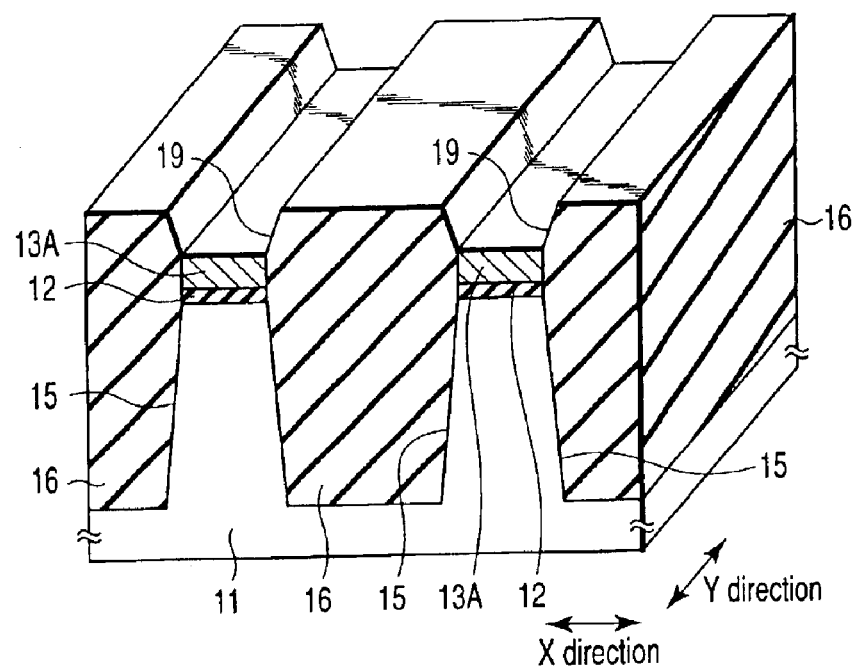
FIG. 20 is a perspective view showing a step of the method of implementing the structure shown in FIG. 18.

Next, as shown in FIG. 20, the process of widening the recess on each conductive layer 13A is executed. For example, these recesses on the conductive layers 13A are widened by rounding (tapering) the corners of the insulating layers 16 by selective etching. Consequently, the side surfaces of each recess are inclined, and this makes the recess widest in its uppermost portion.

Figure 21:
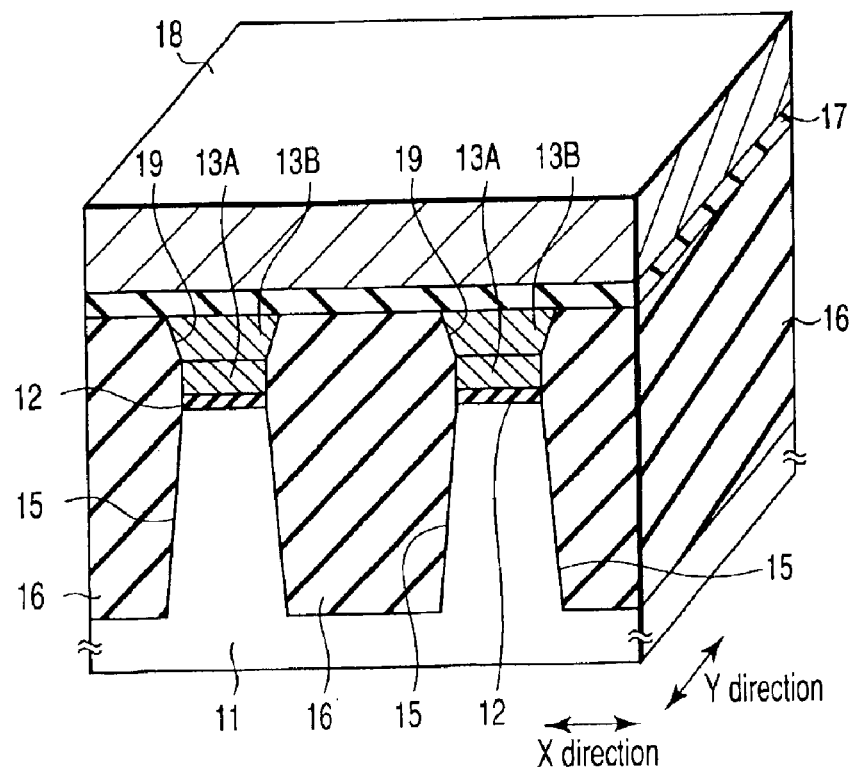
FIG. 21 is a perspective view showing a step of the method of implementing the structure shown in FIG. 18.

As shown in FIG. 21, a conductive layer 13B which completely fills the recesses and completely covers the element isolation insulating layers 16 is formed by CVD. In this embodiment, this conductive layer 13B is made of, e.g., conductive polysilicon containing an impurity, the same material as the conductive layers 13A. The conductive layer 13B is then polished by CMP and left behind only in the recesses. That is, the conductive layers 13B are polished to such an extent that their upper surfaces are substantially leveled with the element isolation insulating layers 16. The element isolation insulating layers 16 function as stoppers in CMP.

After that, a gate insulating layer 17 and a conductive layer 18 for forming a control gate electrode are sequentially formed on the conductive layers 13A and 13B and element isolation insulating layers 16 by CVD. The gate insulating layer 17 is an insulating layer having a high dielectric constant. The conductive layer 18 is made of, e.g., conductive polysilicon containing an impurity.

Figure 22:
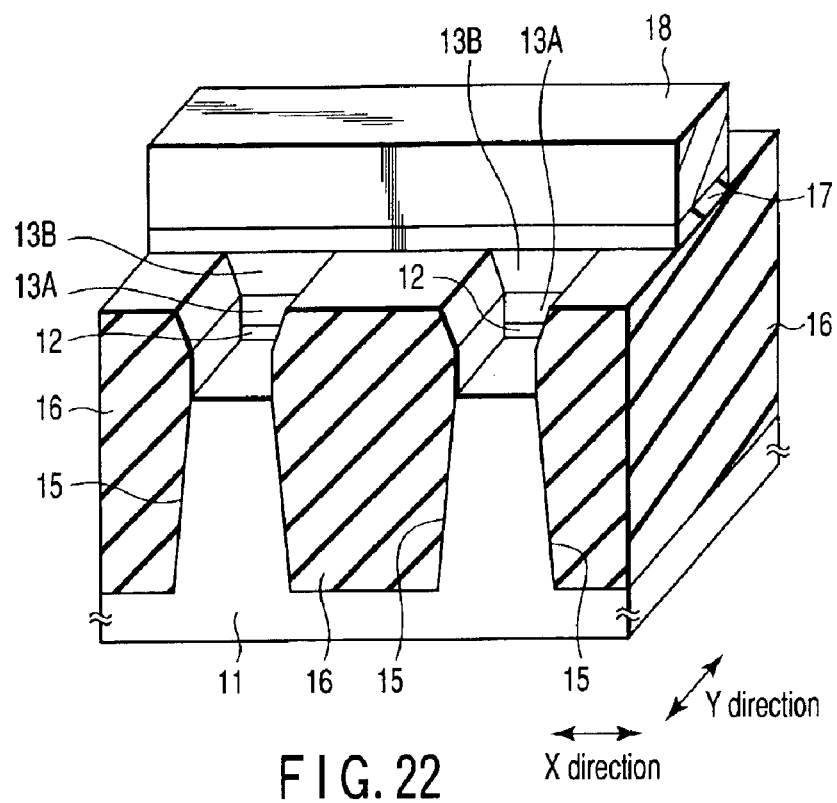
FIG. 22 is a perspective view showing a step of the method of implementing the structure shown in FIG. 18.

Finally, as shown in FIG. 22, a resist pattern is formed by PEP, and gate fabrication is performed by using this resist pattern. That is, the resist pattern is used as a mask to etch the conductive layer 18 by RIE, thereby forming a control gate electrode. Subsequently, the gate insulating layer 17, conductive layers 13A and 13B, and tunnel oxide films 12 are etched to form floating gate electrodes.

Through the above steps, the cell array structure shown in FIG. 18 is completed.

③ Summary

In the cell array structure and manufacturing method of the same as described above, the same effects as in the first and second embodiments can be obtained. That is, it is possible to increase the capacitance between the floating gate electrode and control gate electrode, and achieve high integration and a low write potential at the same time. In addition, the multilayered structure of the floating gate electrode eliminates problems in fabrication and guarantees a minimum value of the thickness of the floating gate electrode. Furthermore, the recess in which the floating gate electrode is formed is widest in its uppermost portion. This increases the area of a portion where the floating gate electrode opposes the control gate electrode.

4. Application Example

An application example using the nonvolatile semiconductor memory device according to the embodiments of the present invention will be explained below.

Figure 23:
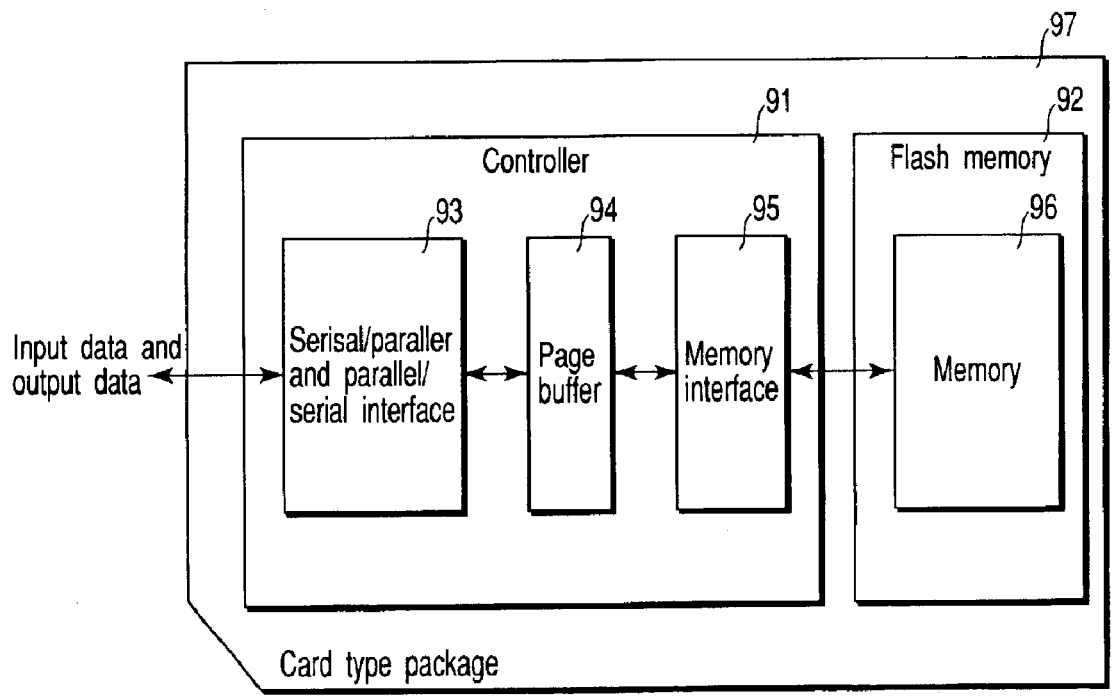
FIG. 23 is a view showing an application example of the memories according to the embodiments of the present invention.

FIG. 23 is a block diagram showing an example of a memory card.

A memory card 97 includes a memory chip (flash memory) 92 as a main memory and a controller chip (controller) 91 for controlling this memory chip 92. Of circuit blocks contained in the controller chip 91, only circuit blocks pertaining to the main memory will be described below.

Examples of the circuit blocks related to the main memory are a serial/parallel and parallel/serial interface 93, page buffer 94, and memory interface 95.

When data is to be written in the memory chip 92, the interface 93 converts, e.g., serial input data into parallel internal data. The converted parallel internal data is input to the page buffer 94 and stored in it. The stored internal data is written in the memory chip 92 via the memory interface 95.

To read out data from the memory card 97, the data read out from the memory chip 92 is input to and stored in the page buffer 94 via the memory interface 95. The stored internal data is input to the interface 93 where the parallel internal data is converted into serial output data. This serial data is output to the outside of the memory card 97.

The controller chip 91 and memory chip 92 as described above are housed in, mounted on, or adhered to a card type package. Consequently, this card type package functions as a memory card.

The nonvolatile semiconductor memory device according to the embodiments of the present invention is used in a memory circuit 96 of the memory chip 92, and accurately controls a threshold distribution width while performing high-speed write operations. Therefore, the memory card 97 has the advantage that it can increase the speed of data exchange with, particularly the speed of data written from, an electronic apparatus to which this memory card 97 is connected. This advantage makes the memory card 97 using the nonvolatile semiconductor memory device according to the embodiments of the present invention useful as a recording medium of an electronic apparatus, such as a video camera, digital still camera, or personal digital assistant, required to perform high-speed data write.

5. Others

In the first to third embodiments, the gate insulating layer can be made of a material having a dielectric constant higher than that of the tunnel oxide film ($SiO_2$). For example, the gate insulating layer can be a layer containing at least one of aluminum oxide, hafnium oxide, silicon oxide, and silicon nitride.

In the second and third embodiments, after recesses (FIGS. 15 and 20) are formed on the conductive layers 13A, it is also possible to subsequently polish the element isolation insulating layers 16 by CMP without forming any conductive layers 13B. In this case, the device structure of the first embodiment can be obtained by substantially leveling the upper surfaces of the element isolation insulating layers 16 with the upper surfaces of the conductive layers 13A.

The embodiments of the present invention are applicable to a nonvolatile semiconductor memory device which uses a MOS transistor having a floating gate electrode and control gate electrode as a memory cell. An example is a flash memory having a NAND, AND, or NOR cell array structure.

In the embodiments of the present invention as explained above, the dielectric constant of the gate insulating layer is increased, and the thickness of this gate insulating layer is decreased. This makes it possible to increase the capacitance between the floating gate electrode and control gate electrode, thereby simultaneously achieving high integration of memory cells and a low voltage of a write pulse.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A nonvolatile semiconductor memory device comprising:
    a semiconductor substrate;
    a first insulating layer having a projection which projects from the semiconductor substrate and has a flat upper surface;
    a floating gate electrode which is formed in a recess formed by the projections, and which has an upper surface substantially leveled with the upper surface of the first insulating layer;
    a second insulating layer formed on the upper surface of the first insulating layer and the upper surface of the floating gate electrode; and
    a control gate electrode formed on the second insulating layer,
    wherein the second insulating layer is made of a material having a dielectric constant higher than that of silicon oxide, and
    wherein the width of the recess is not constant but is largest in the uppermost portion of the recess.

2. The nonvolatile semiconductor memory device according to claim 1, wherein the area of a portion where the floating gate electrode opposes the control gate electrode is larger than the area of a portion where the floating gate electrode opposes the semiconductor substrate.

3. The nonvolatile semiconductor memory device according to claim 1, wherein the first insulating layer is an element isolation insulating layer having an STI structure.

4. The nonvolatile semiconductor memory device according to claim 1, wherein the floating gate electrode is made up of a plurality of stacked layers.

5. The nonvolatile semiconductor memory device according to claim 1, wherein the second insulating layer is in contact with the floating gate electrode only on the upper surface thereof.

6. The nonvolatile semiconductor memory device according to claim 1, wherein the second insulating layer contains at least one of aluminum oxide, hafnium oxide, silicon oxide, and silicon nitride.

7. The nonvolatile semiconductor memory device according to claim 1, wherein memory cells having the floating gate electrode and control gate electrode form a NAND, AND, or NOR cell array structure.

* * * * *